US012002861B2

(12) United States Patent
Glass et al.

(10) Patent No.: US 12,002,861 B2
(45) Date of Patent: Jun. 4, 2024

(54) METHOD OF FORMING CONDUCTIVE CONTACTS ON GRAPHENE

(71) Applicant: PARAGRAF LIMITED, Somersham (GB)

(72) Inventors: Hugh Glass, Somersham (GB); Ivor Guiney, Somersham (GB); Martin Tyler, Somersham (GB); Simon Thomas, Somersham (GB)

(73) Assignee: Paragraf Limited, Somersham (GB)

( * ) Notice: Subject to any disclaimer, the term of this patent is extended or adjusted under 35 U.S.C. 154(b) by 324 days.

(21) Appl. No.: 17/626,961

(22) PCT Filed: Jul. 7, 2020

(86) PCT No.: PCT/EP2020/069086
§ 371 (c)(1),
(2) Date: Jan. 13, 2022

(87) PCT Pub. No.: WO2021/008939
PCT Pub. Date: Jan. 21, 2021

(65) Prior Publication Data
US 2022/0293744 A1    Sep. 15, 2022

(30) Foreign Application Priority Data
Jul. 16, 2019    (GB) .................................... 1910193

(51) Int. Cl.
*H01L 29/40*    (2006.01)
*H01L 21/04*    (2006.01)
(Continued)

(52) U.S. Cl.
CPC .......... *H01L 29/401* (2013.01); *H01L 21/043* (2013.01); *H01L 31/0216* (2013.01);
(Continued)

(58) Field of Classification Search
CPC . H01L 29/401; H01L 21/043; H01L 31/0216; H01L 31/0224; H01L 33/40;
(Continued)

(56) References Cited

U.S. PATENT DOCUMENTS

| 9,245,664 | B2 * | 1/2016 | Kirk .......................... H01B 1/22 |
| 2013/0022811 | A1 * | 1/2013 | Ahn ..................... C23C 16/0272 |
| | | | 977/734 |

(Continued)

FOREIGN PATENT DOCUMENTS

| CN | 106647183 A | 5/2017 |
| CN | 107275477 A | 10/2017 |

OTHER PUBLICATIONS

International Search Report and Written Opinion, PCT/EP2020/069086, dated Sep. 25, 2020, 14 pages.

(Continued)

*Primary Examiner* — S M Sohel Imtiaz
(74) *Attorney, Agent, or Firm* — Stinson LLP

(57) ABSTRACT

The present invention provides a method of providing an electrical contact on a graphene surface, the method comprising: (i) providing a graphene layer structure comprising one or more graphene layers and having a polymer coating on a surface thereof; (ii) contacting one or more portions of the polymer coating with a conductive metal-containing composition comprising a solvent, wherein the polymer coating is soluble in the solvent: and (iii) volatilising the solvent to deposit the conductive metal on the surface of the graphene layer structure.

20 Claims, 2 Drawing Sheets

(51) Int. Cl.
*H01L 31/0216* (2014.01)
*H01L 31/0224* (2006.01)
*H01L 33/40* (2010.01)
*H01L 33/44* (2010.01)
*H01L 29/16* (2006.01)
*H01L 29/45* (2006.01)

(52) U.S. Cl.
CPC .......... *H01L 31/0224* (2013.01); *H01L 33/40* (2013.01); *H01L 33/44* (2013.01); *H01L 29/1606* (2013.01); *H01L 29/45* (2013.01); *H01L 2933/0016* (2013.01); *H01L 2933/0025* (2013.01)

(58) Field of Classification Search
CPC ..... H01L 33/44; H01L 29/1606; H01L 29/45; H01L 29/413; H01L 21/02
See application file for complete search history.

(56) References Cited

U.S. PATENT DOCUMENTS

| | | | | |
|---|---|---|---|---|
| 2013/0142963 | A1* | 6/2013 | Kirk | H01B 1/22 252/514 |
| 2014/0021445 | A1* | 1/2014 | Heo | H01L 29/778 257/27 |
| 2014/0057425 | A1* | 2/2014 | Afzali-Ardakani | H01L 29/68 257/E21.209 |
| 2014/0141265 | A1* | 5/2014 | Shin | H01L 29/1606 428/448 |
| 2015/0270358 | A1* | 9/2015 | Albarakaty | H01L 21/043 438/105 |
| 2015/0364329 | A1* | 12/2015 | Dal | H01L 21/02491 438/664 |
| 2018/0108740 | A1* | 4/2018 | Renard | H01L 21/043 |
| 2018/0130882 | A1* | 5/2018 | Colombo | H01L 29/41725 |
| 2018/0308696 | A1* | 10/2018 | Colombo | H01L 29/45 |
| 2019/0288156 | A1* | 9/2019 | Chaji | H01L 29/42312 |
| 2020/0152679 | A1* | 5/2020 | Sato | H01L 27/14612 |
| 2021/0043830 | A1* | 2/2021 | Lara-Avila | H01L 21/0332 |
| 2022/0246718 | A1* | 8/2022 | Cho | H01L 29/04 |

OTHER PUBLICATIONS

International Preliminary Report on Patentability, PCT/EP2020/069086, dated Jul. 2, 2021, 7 pages.
Great Britain Search Report, Application No. GB1910193.0, dated Jan. 7, 2020, 5 pages.

* cited by examiner

METHOD OF FORMING CONDUCTIVE CONTACTS ON GRAPHENE

REFERENCE TO RELATED APPLICATIONS

This application is the 371 U.S. national stage application of International Patent Application No. PCT/EP2020/069086, filed Jul. 7, 2020, which claims the benefit of Great Britain Patent Application No. 1910193.0, filed Jul. 16, 2019, the entire disclosures of which are incorporated herein by reference.

The present invention relates to a method of providing an electrical contact on a graphene surface. In particular, the method of the invention provides an improved approach to making electrical contacts on graphene surfaces having a polymer resist coating on the surface, without the need for photolithography processes, such as UV curing and solvent rinses.

Graphene is a well-known material with a plethora of proposed applications driven by the material's theoretical extraordinary properties. Good examples of such properties and applications are detailed in 'The Rise of Graphene' by A. K. Geim and K. S. Novoselev, *Nature Materials*, Volume 6, 183-191, March 2007 and in the focus issue of *Nature Nanotechnology*, Volume 9, Issue 10, October 2014.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors.

Graphene is being investigated for a range of potential applications in radio frequency analog transistors, photodetectors and nanoelectromechanical systems. It is necessary to incorporate a device comprising graphene into an electrical circuit and therefore it is typically desirable to form metal-graphene contacts. Common metallic contacts used in the art include those based on gold, silver and nickel including combinations thereof.

Metallic contacts may be formed by physical vapour deposition methods such as sputtering and evaporation and also electrodeposition methods such as electroplating. Electrodeposition is used extensively to fabricate gold-plated contacts on devices. Such contacts may be patterned using "through-mask" plating techniques.

CN 107275477 relates to a carbon-based power supply (battery), the method of preparation comprises adhesion of graphene sheets to flexible polymer sheets by chemical transfer or spin coating and the preparation of microelectrodes by electron beam exposure or photolithography technology to form a conductive film on the surface of the graphene sheet.

CN 106647183 relates to a graphene device formed by a method of deep ultraviolet photolithography and the subsequent deposition of a metal electrode on the graphene surface.

US 2016/0116432 relates to an electrochemical sensor that includes a first and second electrode extending over the first side of a substrate, a graphene layer extending over the first side of the substrate in electrical contact with the first and second electrodes. A structural layer of dry resist is provided on the graphene layer. There is disclosed the steps of lithographic definition and selective removal of the film of dry resist to obtain channels and chambers for containments of liquids.

CN 105226075 relates to a method for manufacturing a high-voltage light-emitting diode transparent conductive layer, the method comprising preparing graphene by chemical vapour deposition (CVD) which is transferred to an LED epitaxial wafer, coating a photoresist on the surface of the epitaxial wafer, patterning by photolithography and exposing the underlying GaN layer of the LED epitaxial wafer by physical etching. The photoresist is removed, and a mask layer of $SiO_2$ is deposited which is patterned by lithography followed by evaporation of metallic gold by electron beam and use of the lithographic pattern to form metallic gold electrodes.

'Simple Photolithography Process for a Graphene-Based Device with Edge Contact' by S. Park et al., *Nanoscience and Nanotechnology Letters*, Volume 10, 1-8, 2018, relates to a method for the fabrication of edge contact between CVD grown graphene and metal electrodes by a photolithography process that uses a bilayer resist. An electron beam evaporator was used to deposit Au/Ti (50/1 nm) electrodes and a conventional lift-off process was carried out to remove the photoresist.

However, there remains a need for fast and low-cost processing methods for fabricating devices comprising graphene. It is an object of the present invention to provide an improved method for the production of electrical contacts on a graphene surface, which overcomes, or substantially reduces, problems associated with the prior art or to at least provide a commercially viable alternative thereto.

Accordingly, in a first aspect there is provided a method of providing an electrical contact on a graphene surface, the method comprising:
  (i) providing a graphene layer structure comprising one or more graphene layers and having a polymer coating on a surface thereof;
  (ii) contacting one or more portions of the polymer coating with a conductive metal-containing composition comprising a solvent, wherein the polymer coating is soluble in the solvent; and
  (iii) volatilising the solvent to deposit the conductive metal on the surface of the graphene layer structure.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The improved method as described herein is simpler, requiring fewer process steps and is more reliable than those known in the prior art. The method allows for the production of electric contacts on a graphene surface through a polymer coating which avoids detrimental exposure of the graphene to air and the environment. As a result, an improved device per se comprising graphene with conductive contacts may be provided which is itself more robust, durable and reliable.

The step of providing a graphene layer structure comprising one or more graphene layers and having a polymer coating on a surface thereof can be achieved by any method known in the art.

A graphene layer structure may be prepared by methods such as liquid exfoliation, solid exfoliation, oxidation-exfoliation-reduction and intercalation-exfoliation. These methods typically employ bulk graphite as a raw starting material relying on exfoliation (in a top-down approach) as the method by which individual graphene sheets are separated from the bulk. Graphene may be prepared using chemical vapour deposition (CVD) techniques. Preferably, a graphene layer structure is prepared by vapour phase epitaxy (VPE) and/or by metal-organic chemical vapour deposition (MOCVD). Preferably, graphene is prepared by the method disclosed in WO 2017/029470, i.e. an MOCVD-type technique.

MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. CVD techniques cannot be used to achieve high quality graphene layer structures.

MOCVD can also be readily distinguished from atomic layer deposition (ALD) techniques. ALD relies on step-wise reactions of reagents with intervening flushing steps used to remove undesirable by products and/or excess reagents. It does not rely on decomposition or dissociation of the reagent in the gaseous phase. It is particularly unsuitable for the use of reagents with low vapour pressures such as silanes, which would take undue time to remove from the reaction chamber. MOCVD growth of graphene is discussed in WO 2017/029470.

The method of WO 2017/029470 provides two-dimensional materials with a number of advantageous characteristics including: very good crystal quality; large material grain size; minimal material defects; large sheet size; and self-supporting. Graphene is a well-known term in the art and refers to an allotrope of carbon comprising a single layer of carbon atoms in a hexagonal lattice. The term graphene used herein encompasses structures comprising multiple graphene layers stacked on top of each other. The term graphene layer is used herein to refer to a graphene monolayer. Said graphene monolayers may be doped or undoped. The graphene layer structures disclosed herein are distinct from graphite since the layer structures retain graphene-like properties.

Accordingly, in a preferred embodiment of the present invention, step (i) of the method as described herein of providing the graphene layer structure comprises:

providing a substrate on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form a graphene layer structure on the substrate, wherein the inlets are cooled to less than 100° C. and the susceptor is heated to a temperature of at least 50° C. in excess of a decomposition temperature of the precursor.

Even more preferably, the inlets are cooled to a temperature of from about 50° C. to about 60° C.

The graphene layer structure may comprise one or more graphene layers. Preferably, the graphene layer structure comprises from 1 to 50 graphene layers, more preferably from 10 to 30 graphene layers.

Preferably, the method as described herein comprises the step of providing a graphene layer structure wherein the graphene layer structure is provided on a substrate. Exemplary substrates that may be used in the method as described herein include silicon (Si), silicon carbide (SiC), silicon dioxide ($SiO_2$), sapphire ($Al_2O_3$) and III-V semiconductor substrates or combinations of two or more thereof. III-V semiconductor substrates may include binary III-V semiconductor substrates such as GaN and AlN and also tertiary, quaternary and higher order III-V semiconductor substrates such as InGaN, InGaAs, AlGaN, InGaAsP. Preferably, the graphene layer structure is provided on a substrate selected from silicon, silicon carbide, silicon dioxide, sapphire and III-V semiconductors.

According to preferred embodiments, the substrate may be a light-emitting or light-sensitive device, such as an LED or a photovoltaic cell. It is desirable to provide such a device with electrical contacts using the method described herein.

The graphene layer structure comprising one or more graphene layers is provided having a polymer coating on a surface thereof. The polymer coating may be formed by any method known in the art. Preferably the coating is provided as a passivation layer to the graphene to prevent contact with air or moisture. Preferably the coating is formed before the graphene is exposed to air or moisture once it has been formed, or after only minimal exposure.

The method of forming the polymer coating preferably comprises spin coating. Spin coating is used to deposit thin films onto substantially flat surfaces such as the surface of a graphene layer structure. A small amount of the material is applied to the center of the substrate whilst the substrate is not spinning or spinning slowly. The substrate is then spun at high speed in order to spread the coating material by centrifugal force. Typically, rotation speeds may be greater than 1000 rpm (16.7 Hz), however, good film quality may be achieved at speeds as low at 500 rpm (8.3 Hz). Rotation speeds may be up to 12000 rpm (200 Hz). Rotation is typically continued until the film is fully dry, therefore, rotation time typically depends on the boiling point and vapour pressure of the solvent. Common solvents include water, isopropyl alcohol, acetone, toluene and chloroform including combinations thereof. Rotation is continued until a desired thickness of film is achieved; this may be approximately 30 seconds. Preferably, the thickness of the polymer coating according to the present invention is from 50 nm to 500 nm, more preferably from 100 nm to 300 nm. Preferably, the polymer coating has a substantially uniform thickness across the surface of the graphene layer structure.

Any materials known in the art may be used to form the polymer coating provided that the polymer coating may be dissolved in a suitable solvent. In a preferred embodiment, the polymer coating comprises poly(methyl methacrylate) (PMMA), polyethylene terephthalate (PET), polyphenylene ether ether sulfone (PPEES), poly(2,6-dimethyl-1,4-phenylene oxide), polyurethane, polyethylene, polyvinylidene fluoride (PVDF) and/or poly(tetrafluoroethylene) (PTFE). PMMA, PPEES and poly(2,6-dimethyl-1,4-phenylene oxide) are especially preferred. The method of forming a polymer coating may comprise spin coating a solution comprising the polymeric material. Alternatively, the method may comprise spin coating a polymeric precursor which may then be subsequently polymerised to form the polymeric coating. By way of example, the method of forming a polymer coating comprising PMMA may comprise spin coating which comprises spin coating a precursor comprising methyl methacrylate on a surface of a graphene layer structure. After spinning, a post-bake (annealing) is performed to polymerise the methyl methacrylate and form the PMMA polymeric coating. A post-bake (annealing) may comprise heating at about 100° C. to about 200° C. for about 1 minute to about 120 minutes. This may be carried out on a hot-plate (such as for small sized substrates) or in an oven. Preferably, the graphene layer structure having a polymer coating provided thereon is annealed at about 130° C. for 60 minutes.

The inventors have found that graphene, in particular the surface of graphene, is sensitive to a range of gases present in ambient air. The properties of graphene and graphene layer structures (such as electrical and optical properties) can be dramatically altered by the adsorption of atmospheric gases, in particular oxygen and water. The extent to which the adsorption of atmospheric gases have an effect on the properties of graphene layer structures may depend on factors such as the number of graphene layers in the graphene layer structure and type and magnitude of doping.

Advantageously, the inventors have found that the method as described herein allows for the provision of an electrical contact on a graphene surface having a polymer coating on the surface thereof without having to expose the underlying graphene to the ambient atmosphere which otherwise occurs by removal of a part of the polymer coating. Preferably, when providing a polymer coating on a surface of a graphene layer structure, this is performed in a low oxygen and low moisture environment. Alternatively, it can be provided quickly after the graphene layer has been removed from the MOCVD chamber to minimise oxygen and moisture exposure. Preferably, the formed graphene is kept under a low oxygen and low moisture environment which preferably comprises, even more preferably consists of, an inert gas. Preferably, the inert gas is selected from the group consisting of dinitrogen ($N_2$), dihydrogen ($H_2$), helium (He) and argon (Ar), even more preferably from dinitrogen and dihydrogen. A low oxygen and/or low moisture environment is intended to mean an environment where oxygen and/or moisture are excluded, however, unavoidable amounts of oxygen and/or moisture may be present. Accordingly, a low oxygen and/or low moisture environment may include oxygen and/or moisture (that is $O_2$ and $H_2O$) in amounts no greater than 1000 ppm, preferably no greater than 500 ppm. A low oxygen and/or low moisture environment may include oxygen and/or moisture in amounts less than 200 ppm, 50 ppm, 10 ppm or less than 1 ppm.

Accordingly, in a preferred embodiment of the present invention, step (i) of the method as described herein of providing the graphene layer structure comprises:
spin-coating a polymer solution onto the surface of the graphene layer structure and drying the polymer solution to form the polymer coating, preferably wherein the step of spin-coating is performed in a low oxygen and low moisture environment.

The use of photoresists (polymer coatings), light-sensitive materials used to form a patterned coating on a surface in processes such as photolithography, in the wafer fabrication industry is well known in the art. Photoresists typically comprises multiple components including a polymer whose structure changes on exposure to light; a solvent to thin (reduce the viscosity of) the resist so that is may be applied to the substrate by spin coating; sensitisers which help control the chemical reactions that take place on exposure to light; and additives to achieve specific process results, for example, dyes.

In methods known in the prior art which involve the use of photolithographic processes, a patterned mask is then applied to the surface of the coated substrate which is then exposed to light (such as ultra-violet light). The mask blocks areas of the light so that only unmasked portions are exposed. A developer (such as a solvent) may then be applied to the surface to dissolve regions that were exposed to light where the photo-sensitive material is degraded by light (a so-called positive photoresist). Alternatively, the areas that were unexposed to light are dissolved by the developer where the photo-sensitive material is strengthened by light, for example by cross-linking or polymerisation of the organic material (a so-called negative photoresist). The resulting substrate comprises a patterned photoresist material disposed upon its surface.

The method as described herein comprises the step of contacting one or more portions of the polymer coating with a conductive metal-containing composition comprising a solvent, wherein the polymer coating is soluble in the solvent.

Methods of contacting a substrate with compositions comprising organic and/or inorganic materials is known in the art. Such methods of printing electronics uses printing equipment suitable for defining patterns on a substrate. These included screen printing, flexography, gravure, offset lithography and inkjet printing.

Preferably, step (ii) of the method as described herein of contacting one or more portions of the polymer coating with a conductive metal-containing composition comprises inkjet printing the solution onto the polymer coating.

Inkjet printing advantageously allows the control of the flow of the conductive metal-containing composition in a precise manner so that a known volume of the composition is deposited on to the polymer coating. Inkjet printing allows for the printing of thin layers below 100 nm at reasonable resolution (50 µm). Inkjet printing allows for the use of a range of inks to be printed with a dynamic viscosity of from about 1 mPa·s to about 20 mPa·s. Preferably, the conductive metal-containing solution as described herein has a dynamic viscosity of from about 1 mPa·s to about 20 mPa·s.

Inkjet printing is known in the art and may be broadly classified into two categories: continuous inkjet (CIJ) and drop-on-demand inkjet (DOD). The latter, DOD, may be classified into three further categories: thermal, piezoelectric and electrostatic inkjet printing.

The conductive metal-containing solution delivers the conductive metal which ultimately forms the electrical contact on the graphene surface. Preferably, the conductive metal-containing solution comprises silver (Ag), gold (Au), nickel (Ni) or titanium (Ti) or mixtures of two or more thereof. Preferably, the conductive metal-containing solution comprises only one of Ag, Au, Ni or Ti.

The conductive metal-containing solution comprises a conductive metal as described herein. The conductive metal is present in the conductive metal-containing solution in metallic form, i.e. as a suspension. In other words, the conductive metal is present in the zero oxidation state and is not present as a compound (such as an ionic or organometallic compound). Preferably, the conductive metal comprises metallic nanoparticles. Even more preferably, the conductive metal comprises metallic nanoparticles wherein at least one of its dimensions is in the nanometer size range, preferably about 1 nm to about 100 nm. Preferably, the nanoparticles should be about 0.01 times the diameter of the printhead orifice (of, for example, an inkjet printer). Accordingly, the average particle size is preferably about 1 nm to about 100 nm, even more preferably about 30 nm to about 50 nm.

The conductive metal-containing solution comprises a solvent. The solvent is selected such that the polymer coating is soluble in the solvent. A polymer coating may be considered to be soluble in a solvent if the ratio of the mass of solvent required to dissolve an equivalent mass of polymer is less than 30:1. A polymer coating may be considered to be freely soluble in a solvent if the ratio of mass of solvent to mass of polymer is less than 10:1 and very soluble if the ratio is less than 1:1. Solubility is temperature dependent and the polymer coating may therefore have the required solubility in a solvent at higher temperatures. The temperature at which the polymer's solubility is measured is the temperature at which the conductive metal-containing solution is applied.

Advantageously, the inventors have found that not only is dissolution of the polymer aided by the increase in temperature, if the temperature is greater than the glass transition temperature of the polymer coating, this further aids the passage of the conductive metal through the polymer to the surface of the graphene layer structure. Accordingly, in a preferred embodiment of the present invention, the step of contacting one or more portions of the polymer coating with a conductive metal-containing composition comprising a solvent, involves heating the coated graphene layer structure to a temperature greater than the glass transition temperature of the polymer coating.

The solvent may comprise an alcohol, ester, ketone or a mixture thereof. Preferably, the solvent comprises one or more of acetone (propanone), methyl acetone (MEK, methyl ethanoate) and diacetone alcohol (DAA, 4-hydroxy-4-methylpentan-2-one). Acetone, methyl acetone and diacetone alcohol are particularly suitable for dissolving PMMA and PPEES.

According to the method as described herein, the amount of conductive metal in the conductive metal-containing composition may be from 20 wt % to 80 wt %, preferably from 40 wt % to 70 wt %. The amount of conductive metal in the conductive metal-containing composition is preferably is high as possible. However, other factors affect the amount of conductive metal that may be included. Solvent is required as a component of the composition to dilute the composition in order to provide a composition having, for example, a suitable viscosity. Therefore, in another preferred embodiment, the amount of solvent in the conductive metal-containing composition is from 20 wt % to 80 wt %, preferably from 30 wt % to 60 wt %.

The method as described herein comprises the step of volatilising the solvent to deposit the conductive metal on the surface of the graphene layer structure. The solvent may volatilise over time under ambient conditions. The solvent may be volatilised under a flow of a gas. The solvent may be volatilised by heating the graphene layer structure. Preferably, the step of volatilising the solvent comprises heating the graphene layer structure to a temperature greater than 100° C., such as 100 to 300° C., preferably 150 to 250° C. The time required to volatilise the solvent is dependent on, for example, the volatility of the solvent used and the temperature. The step of volatilising the solvent comprises volatilising the solvent until all the solvent has been volatilised, which may take a total time of 5 minutes at ambient temperature and which may be reduced if the step of volatilising the solvent comprises heating the graphene layer structure.

The method comprises multiple steps. It will be apparent to one of ordinary skill in the art that these steps may be conducted sequentially, but it will also be appreciated that the steps may be conducted simultaneously. In particular, the step of contacting one or more portions of the polymer coating with a conductive metal-containing composition may be carried out at temperatures greater than 60° C., preferably greater than 90° C., for example 130° C. Therefore, this step may simultaneously achieve both steps of contacting one or more portions of the polymer coating with a conductive metal-containing composition and of volatilising the solvent to deposit the conductive metal on the surface of the graphene layer structure.

Advantageously, the inventors have discovered that electrical contacts may be provided on a graphene surface by a process as described herein which does not require undue process complexity. In particular, the process allows the provision of electrical contacts on a graphene surface without having to expose the graphene surface to the atmosphere (in particular to oxygen and/or moisture) which would otherwise compromise the integrity and properties of the graphene layer structure.

The process relies on etching through the protective polymer barrier coating that is provided on the surface of the graphene layer structure. Etching is achieved through the use of a conductive metal-containing composition (also known as a metallic composition, metallic paint, conductive ink or the like).

The composition (paint or ink) may be applied by processes such as inkjet printing quickly and accurately without having to remove a portion of the polymer coating. Therefore, the present invention avoids the need for additional process steps that are known to be required when using methods that involve, for example, photolithography. The inventors have discovered that the solvent present in a conductive metal-containing composition may dissolve the polymer coating (provided that the polymer coating is soluble in the solvent). As a result, electrical contacts may be provided on a graphene surface quickly and accurately without removing a portion of the polymer coating and therefore, without exposing the surface of the graphene layer structure to the atmosphere. This is particularly important given the sensitivity of the substrate to air or moisture.

The solvent is volatilised (made to become gaseous) in order to deposit the conductive metal on the surface of the graphene and thereby form the electrical contact.

One particular advantage of the present invention is the suitability of this approach to forming an electrical contact on graphene rather than other semiconductor materials (such as silicon). The inventors have realised that since graphene does not have a band-gap, the electrical contacts may be provided by simple metallic deposition. In contrast, for other semiconductors such as silicon and gallium nitride (GaN), a fairly complex electrical stack is required to overcome the ohmic barrier. Accordingly, the present invention provides improved electrical contacts that allow a greater flow of current.

According to a second aspect, there is provided a polymer-coated graphene layer structure comprising one or more electrical contacts obtainable by the method as described herein.

Unlike prior art graphene devices, the polymer-coated graphene layer structure comprising the one or more electrical contacts formed by the method as described herein represent an improvement over prior art devices in view of the method by which it is formed. The method allows for the formation of electrical contacts without the need for photolithography thereby allowing the formation of electrical contacts without the exposure of the graphene to the atmosphere thereby maintaining the advantageous electrical properties of the graphene. This is particularly true for a polymer-coated graphene layer structure wherein the graphene layer structure is provided by the MOCVD method described herein since this allows for the facile exclusion of atmospheric contaminants. At the very least, the polymer-coated graphene layer structure described herein represents a non-obvious alternative over those which have been formed by photolithography.

The polymer-coated graphene layer structure is particularly advantageous over the prior art in view of the method by which it is formed. That is, the step of contacting one or more portions of the polymer coating with a conductive metal-containing composition comprising a solvent, wherein the polymer coating is soluble in the solvent, allows for a product having electrical contacts on a graphene surface without having to expose the graphene surface to the atmosphere (in particular to oxygen and/or moisture). As discussed above with regards to the method, this would otherwise compromise the integrity and properties of the graphene layer structure. Thus the polymer-coated graphene layer structure as described herein represents an improvement over the prior art (such as a method involving photolithography) in view of the reduced contamination of the graphene from the atmosphere. Such a difference is readily discernible through the electronic properties of the device in which the graphene is used (i.e. improved contact and flow of electrical current from the graphene to the contact and subsequent circuitry).

For the above reasons, it is also particularly preferred that the polymer-coated graphene layer structure according to the second aspect is produced by the method as described herein which includes providing the polymer coating on the surface of the graphene layer structure in a low oxygen and low moisture environment. This ensures that the exposure of the graphene to atmospheric contaminants is reduced throughout the entire manufacturing process (i.e. during both the coating of the polymer and the deposition of the electrical contacts). Prior art methods that involve photolithography inevitably result in the exposure of the graphene to the atmosphere resulting in products that are less effective than the polymer-coated graphene layer structure developed by the present inventors.

By extension of the above, a polymer-coated graphene layer structure formed by the method described herein, wherein the graphene layer structure is provided by MOCVD, is particularly advantageous over exfoliation type methods (i.e. solution and/or suspension "wet" chemistry methods) since such MOCVD allows for the facile control of a low oxygen and moisture environment. As described herein, a low oxygen and low moisture environment may also be referred to as an inert environment (and/or an inert atmosphere). An inert atmosphere may consist essentially of a nitrogen ($N_2$) and/or hydrogen ($H_2$) and/or carbon dioxide ($CO_2$) and/or argon (Ar) atmosphere.

FIGURES

The present invention will now be described further with reference to the following non-limiting Figures, in which:

FIG. 1 illustrates a process for forming electrical contacts on a graphene surface using photolithography techniques. As shown in FIG. 1A, a polymer-coated graphene layer structure is provided comprising a substrate (101), one or more graphene layers (102) and a polymer coating (103) disposed on a surface of the one or more graphene layers (102).

Figure 1:
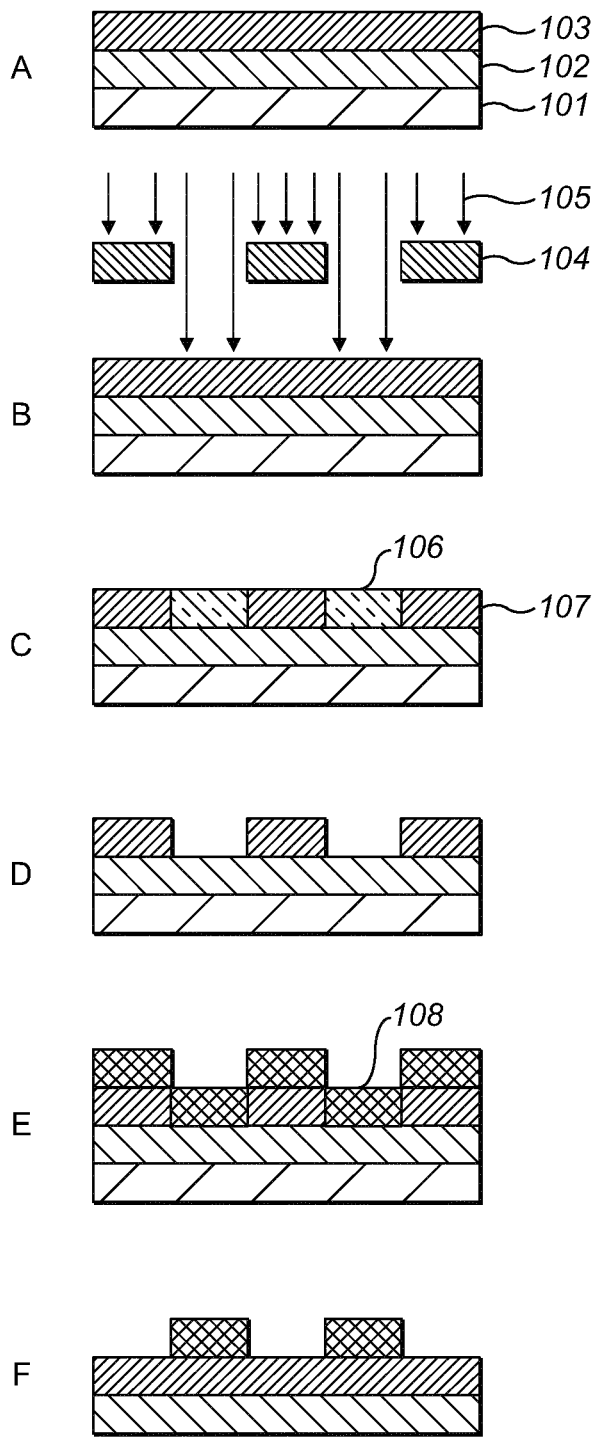
FIG. 1 shows a schematic prior art process for forming electrical contacts on a graphene surface.

A patterned mask (104) is used in order to allow a defined pattern of light (105), such as UV light, to shine through to the polymer coating (103). The polymer coating (103) is a positive photoresist coating meaning than when the polymer coating (103) is exposed to the light (105), a patterned area of the polymer coating (106) becomes soluble. The soluble patterned coating (106) is washed away with a solvent leaving an inverse patterned area of unaffected polymer coating (107) as shown in FIG. 1D.

A metallic coating (108) is then deposited on the surfaces of the graphene layer structure. As shown in FIG. 1E, a graphene layer structure having a patterned polymer coating is obtained with metallic contacts (108) disposed on the exposed surfaces of the one or more graphene layers (102) and on the surfaces of the patterned polymer coating (107).

A "lift-off" step removes the remaining photoresist, i.e. the patterned polymer coating (107), and may be carried out by dissolution of the photoresist with a solvent. This also results in the loss of the metallic coating disposed on the surface of the patterned coating (107) thereby affording a graphene layer structure having metallic contacts (108) disposed on the surface thereof.

Figure 2:
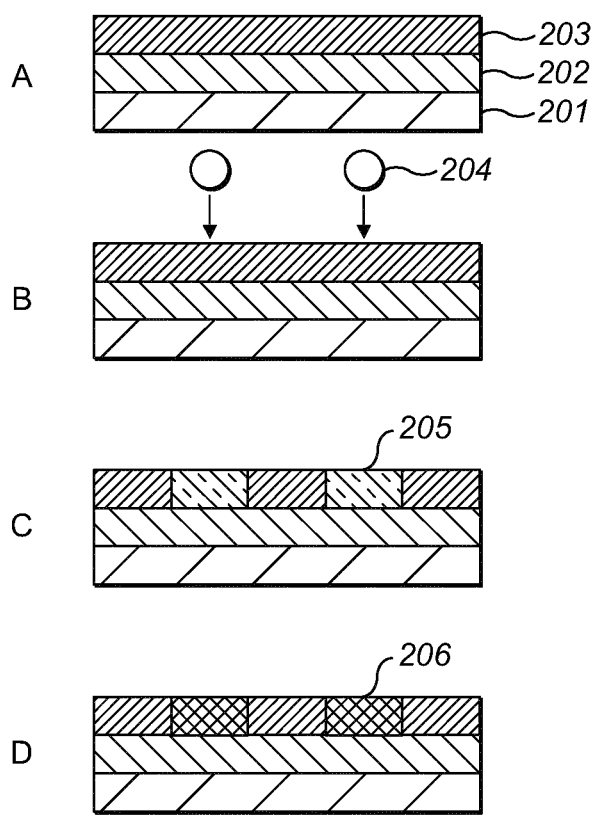
FIG. 2 shows an exemplary schematic process according to the present disclosure.

FIG. 2 illustrates an exemplary method according to the present invention. As shown in FIG. 2A, a polymer-coated graphene layer structure is provided comprising a substrate (201), one or more graphene layers (202) and a polymer coating comprising PMMA (203) disposed on a surface of the one or more graphene layers (202).

Multiple portions of the polymer coating (203) are contacted with a conductive metal-containing composition comprising a solvent (204) such as a conductive silver ink comprising silver nanoparticles in an acetone solvent. This may achieved by, for example, inkjet printing. The polymer coating (203) is soluble in acetone thereby forming a patterned area of a dissolved polymer coating comprising the conductive metal (205). A subsequent step of volatilising the solvent may be to heat the graphene layer structure to 130° C. This results in the volatilisation of the acetone, which is lost to the atmosphere, thereby depositing the silver on the surface of the graphene layer structure and forming the electrical contacts (206) as shown in FIG. 2D.

EXAMPLES

PMMA (6.4 wt %) is spin coated onto a graphene wafer at 6000 rpm (100 Hz) for 60 seconds to afford a 200 nm film. This film is annealed at 130° C. for 60 minutes to dry and anneal the film. Onto this polymer coating is then painted contacts with a silver metal containing paint using a thin copper wire. The sample is left to dry for 5 minutes before annealing at 130° C. for 10 minutes to contact the underlying graphene surface. Good electrical connection was made to the graphene layer without exposing the graphene to air or moisture.

All percentages herein are by weight unless otherwise stated.

As used herein, the singular form of "a", "an" and "the" include plural references unless the context clearly dictates otherwise.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method of providing an electrical contact on a graphene surface, the method comprising:
   (i) providing a graphene layer structure comprising one or more graphene layers and having a polymer coating on a surface thereof;
   (ii) contacting one or more portions of the polymer coating with a conductive metal-containing composition comprising a solvent, wherein the polymer coating is soluble in the solvent, wherein the ratio of solvent to polymer required to dissolve the polymer is less than 30:1 by mass; and
   (iii) volatilising the solvent to deposit the conductive metal on the surface of the graphene layer structure thereby forming one or more electrical contacts.

2. The method according to claim 1, wherein the graphene layer structure comprises from 1 to 50 graphene layers.

3. The method according to claim 1, wherein the graphene layer structure is provided on a substrate.

4. The method according to claim 1, wherein the polymer coating comprises PMMA, PPEES or poly(2,6-dimethyl-1,4-phenylene oxide).

5. The method according to claim 1, wherein the metal in the conductive metal-containing solution comprises Ag, Au, Ni or Ti or mixtures of two or more thereof.

6. The method according to claim 1, wherein the solvent comprises one or more of acetone, methyl acetone and diacetone alcohol.

7. The method according to claim 1, wherein the step (i) of providing the graphene layer structure comprises: providing a substrate on a heated susceptor in a reaction chamber, the chamber having a plurality of cooled inlets arranged so that, in use, the inlets are distributed across the substrate and have a constant separation from the substrate, supplying a flow comprising a precursor compound through the inlets and into the reaction chamber to thereby decompose the precursor compound and form the graphene layer structure on the substrate, wherein the inlets are cooled to less than 100° C., and the susceptor is heated to a temperature of at least 50° C. in excess of a decomposition temperature of the precursor.

8. The method according to claim 1, wherein the step (i) of providing the graphene layer structure comprises:
   spin-coating a polymer solution onto the surface of the graphene layer structure and drying the polymer solution to form the polymer coating, wherein the step of spin-coating is performed in a low oxygen and low moisture environment wherein oxygen and moisture are each present in an amount no greater than 1000 ppm.

9. The method according to claim 1, wherein the step (ii) of contacting one or more portions of the polymer coating with a conductive metal-containing composition comprises inkjet printing the solution onto the polymer coating.

10. The method according to claim 1, wherein the step of volatilising the solvent comprises heating the graphene layer structure.

11. The method according to claim 1, wherein the thickness of the polymer coating is from 50 nm to 500 nm.

12. The method according to claim 1, wherein the amount of conductive metal in the conductive metal-containing composition is from 20 wt % to 80 wt %.

13. The method according to claim 1, wherein the amount of solvent in the conductive metal-containing composition is from 20 wt % to 80 wt %.

14. A polymer-coated graphene layer structure comprising more than one electrical contact obtainable by the method of claim 1.

15. The method according to claim 2, wherein the graphene layer structure comprises from 10 to 30 graphene layers.

16. The method according to claim 3, wherein the substrate is selected from silicon, silicon carbide, silicon dioxide, sapphire and III-V semiconductors.

17. The method according to claim 10, wherein the step of volatilising the solvent comprises heating the graphene layer structure to greater than 100° C.

18. The method according to claim 11, wherein the thickness of the polymer coating is from 100 nm to 300 nm.

19. The method according to claim 12, wherein the amount of conductive metal in the conductive metal-containing composition is from 40 wt % to 70 wt %.

20. The method according to claim 13, wherein the amount of solvent in the conductive metal-containing composition is from 30 wt % to 60 wt %.

* * * * *